(12) United States Patent
Wang et al.

(10) Patent No.: US 11,226,700 B2
(45) Date of Patent: Jan. 18, 2022

(54) SHIFT REGISTER CIRCUIT, DRIVING CIRCUIT, DISPLAY DEVICE, AND DRIVING METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Lei Wang, Beijing (CN); Jigang Sun, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 62 days.

(21) Appl. No.: 16/633,231

(22) PCT Filed: Feb. 20, 2019

(86) PCT No.: PCT/CN2019/075591
§ 371 (c)(1),
(2) Date: Jan. 23, 2020

(87) PCT Pub. No.: WO2020/168491
PCT Pub. Date: Aug. 27, 2020

(65) Prior Publication Data
US 2021/0223902 A1  Jul. 22, 2021

(51) Int. Cl.
*G06F 3/041* (2006.01)
*G09G 3/20* (2006.01)
*G11C 19/28* (2006.01)
*G06F 3/044* (2006.01)
(Continued)

(52) U.S. Cl.
CPC ......... *G06F 3/0416* (2013.01); *G09G 3/2092* (2013.01); *G11C 19/28* (2013.01); *G09G 2310/0286* (2013.01)

(58) Field of Classification Search
USPC .......................................................... 345/173
See application file for complete search history.

(56) References Cited

U.S. PATENT DOCUMENTS

2012/0044166 A1\* 2/2012 Mizuhashi ............ G06F 3/0445
345/173
2013/0127779 A1\* 5/2013 Lillie .................. G06F 3/04166
345/174

(Continued)

*Primary Examiner* — Chineyere D Wills-Burns
(74) *Attorney, Agent, or Firm* — Leason Ellis LLP

(57) ABSTRACT

A shift register circuit, a driving circuit, a display device and a driving method. The shift register circuit including P shift registers that are cascaded and a bypass output circuit, wherein each of the P shift registers includes a first scan output terminal, the first scan output terminal is configured to output a first scan signal, the bypass output circuit includes Q control terminals and a second scan output, the Q control terminals of the bypass output circuit are configured to receive the first scan signal, and the bypass output circuit is configured to output a second scan signal under control of the first scan signal received by the Q control terminals respectively, P is an integer greater than or equal to 2, and Q is an integer less than or equal to P.

19 Claims, 12 Drawing Sheets

(51) Int. Cl.
 *G09G 3/3208* (2016.01)
 *G09G 3/36* (2006.01)

(56) References Cited

U.S. PATENT DOCUMENTS

| | | | |
|---|---|---|---|
| 2013/0169576 A1* | 7/2013 | Wang | G06F 3/041 |
| | | | 345/173 |
| 2015/0160761 A1* | 6/2015 | Lee | G06F 3/04184 |
| | | | 345/174 |
| 2015/0277651 A1* | 10/2015 | Zhang | G06F 3/0416 |
| | | | 345/173 |
| 2016/0259455 A1* | 9/2016 | Li | G06F 3/0412 |
| 2016/0291786 A1* | 10/2016 | Yokoi | G06F 3/0412 |
| 2017/0025068 A1* | 1/2017 | Jeoung | G09G 3/3677 |
| 2017/0076683 A1* | 3/2017 | Lee | G09G 3/3688 |
| 2017/0153742 A1* | 6/2017 | Pang | G09G 3/2096 |
| 2017/0168635 A1* | 6/2017 | Xiang | G09G 3/2096 |
| 2017/0351361 A1* | 12/2017 | Katsuta | G06F 3/04166 |
| 2018/0121023 A1* | 5/2018 | Kim | G06F 3/0443 |

\* cited by examiner

| | |
|---|---|
| S100 | Driving one row pixel units of P rows of pixel units connected with a k-th stage shift register circuit to perform display scanning |
| S200 | Driving one row of touch units connected with the k-th stage shift register circuit to perform touch scanning during at least part of time when the display scanning is performed |

FIG. 15

SHIFT REGISTER CIRCUIT, DRIVING CIRCUIT, DISPLAY DEVICE, AND DRIVING METHOD

CROSS-REFERENCE TO RELATED PATENT APPLICATIONS

This application is a U.S. National Stage Application under 35 U.S.C. § 371 of International Patent Application No. PCT/CN2019/075591, filed Feb. 20, 2019, which is incorporated by reference in its entirety.

TECHNICAL FIELD

Embodiments of the present disclosure relate to a shift register circuit, a driving circuit, a display device, and a driving method.

BACKGROUND

At present, more and more electronic products have both display function and touch function, these electronic products usually adopt touch and display driver integration (TDDI) technology to drive display scanning and touch scanning.

SUMMARY

At least one embodiment of the present disclosure provides a shift register circuit, which includes P shift registers that are cascaded and a bypass output circuit, wherein each of the P shift registers includes a first scan output terminal, the first scan output terminal is configured to output a first scan signal, the bypass output circuit includes Q control terminals and a second scan output, the Q control terminals of the bypass output circuit are configured to receive the first scan signal, and the bypass output circuit is configured to output a second scan signal under control of the first scan signal received by the Q control terminals respectively, P is an integer greater than or equal to 2, and Q is an integer less than or equal to P.

For example, in the shift register circuit provided by an embodiment of the present disclosure, wherein Q=P, the bypass output circuit includes P transistors, P gate electrodes of the P transistors serve as the P control terminals of the bypass output circuit respectively, P first electrodes of the P transistors are connected with each other and serve as the second scan output, and are configured to output the second scan signal.

For example, in the shift register circuit provided by an embodiment of the present disclosure, wherein P second electrodes of the P transistors are connected with each other and are configured to receive a same touch clock signal, and in a case where one or more of the P transistors are turned on, the transistor or transistors being turned on output the touch clock signal as the second scan signal.

For example, in the shift register circuit provided by an embodiment of the present disclosure, wherein P second electrodes of the P transistors receive different touch clock signals respectively, and in a case where one or more of the P transistors are turned on, the transistor or transistors being turned on output received touch clock signals as the second scan signal.

At least one embodiment of the present disclosure also provides a driving circuit, which includes a plurality of shift register circuits, according to any one of claims 1 to 4, which are cascaded.

At least one embodiment of the present disclosure also provides a display device, which includes the driving circuit according to claim 5 and a display panel, the display panel includes a display array and a touch array.

For example, in the display device provided by an embodiment of the present disclosure, wherein the display array includes N rows of pixel units, the touch array includes M rows of touch units, the driving circuit includes M shift register circuits that are cascaded, wherein M bypass output circuits of the driving circuit and the M rows of touch units are connected in one-to-one correspondence, N shift registers in the driving circuit and the N rows of pixel units are connected in one-to-one correspondence to output the first scan signal that enables to turn on the N rows of pixel units row by row, during at least part of time when the N shift registers output the first scan signal, the M bypass output circuits also output the second scan signal to drive the M rows of touch units, wherein N and M are both integers greater than or equal to 2, and N=M*P.

For example, in the display device provided by an embodiment of the present disclosure, wherein the display panel further includes M touch drive lines, an m-th touch drive line is connected to a second scan output of an m-th stage shift register circuit and an m-th row touch unit, the m-th touch drive line is configured to receive the second scan signal from the m-th stage shift register circuit, and transmit the second scan signal to the m-th row touch unit, wherein m is an integer satisfying $1 \leq m \leq M$.

For example, in the display device provided by an embodiment of the present disclosure, wherein the display panel further includes N gate lines, the driving circuit includes N shift registers that are cascaded, an n-th gate line is connected to a first scan output of an n-th stage shift register and an n-th row pixel unit, the n-th gate line is configured to receive the first scan signal from the n-th stage shift register, and transmit the first scan signal to the n-th row pixel unit, wherein n is an integer satisfying $1 \leq n \leq N$.

For example, in the display device provided by an embodiment of the present disclosure, wherein the display panel further includes a plurality of touch detection lines, an amount of the plurality of touch detection lines is equal to an amount of the M rows of touch units, the plurality of touch detection lines and a plurality columns of touch units are connected in one-to-one correspondence, respectively, to receive touch detection signals generated by the plurality columns of touch units driven by the second scan signal.

For example, in the display device provided by an embodiment of the present disclosure, wherein the display panel further includes a plurality of data lines, an amount of the plurality of data lines is equal to an amount of the N rows of pixel units, the plurality of data lines and a plurality columns of pixel units are connected in one-to-one correspondence, respectively, to provide data signals.

For example, the display device provided by an embodiment of the present disclosure, further includes a touch and display driver integrated chip, wherein the touch and display driver integrated chip is configured to provide the touch clock signal for the driving circuit and receive the touch detection signals detected by the touch array.

At least one embodiment of the present disclosure also provides a driving method of the shift register circuit provided by embodiments of the present disclosure, which includes: enabling the P shift registers to output the first scan signal; and enabling the bypass output circuit to output the second scan signal under control of the first scan signal during at least part of time when the P shift registers output the first scan signal.

For example, in the driving method of the shift register circuit provided by an embodiment of the present disclosure, wherein the first scan signal and the second scan signal are both pulse signals, and a pulse width PS1 of the first scan signal and a pulse width PS2 of the second scan signal meet requirements: PS1=a*PS2, a>0.

For example, in the driving method of the shift register circuit provided by an embodiment of the present disclosure, wherein a=10.

For example, in the driving method of the shift register circuit provided by an embodiment of the present disclosure, wherein a period PE1 of the first scan signal and a period PE2 of the second scan signal meet requirements: PE1=b*PE2, b>0.

For example, in the driving method of the shift register circuit provided by an embodiment of the present disclosure, wherein 1≤b≤5.

At least one embodiment of the present disclosure also provides a driving method of any one of display devices provided by embodiments of the present disclosure, which includes: driving one row pixel units of P rows of pixel units connected with a k-th stage shift register circuit to perform display scanning; and driving one row of touch units connected with the k-th stage shift register circuit to perform touch scanning during at least part of time when the display scanning is performed, wherein k is an integer satisfying 1≤k≤M.

For example, in the driving method provided by an embodiment of the present disclosure, wherein the display scanning and the touch scanning are driven by the touch and display driver integrated chip.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

FIG. 15 is a schematic diagram of a driving method of a display device according to some embodiments of the present disclosure.

DETAILED DESCRIPTION

Figure 1A:
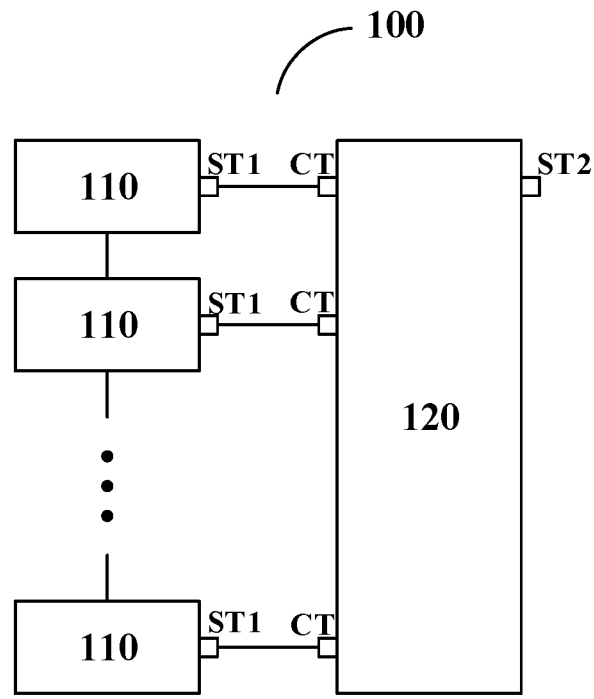
FIG. 1A is a schematic diagram of a shift register circuit according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In display devices adopting touch and display driver integration (TDDI) technology, display scanning and touch scanning are implemented at different time periods, that is, time-sharing scanning mode is adopted. For example, the touch scanning may be implemented in the middle of two frames of the display scanning. For example, the touch scanning may be inserted after each row of display scanning is completed.

When the resolution of the display devices adopting TDDI technology is relatively low, the above time-sharing scanning mode can meet usage requirements, however, as users have higher and higher requirements for the resolution of the display devices, requirements for the distribution of display scanning time and touch scanning time are also higher and higher. When driving a high-resolution display device, the above time-sharing scanning mode may lead to insufficient charging time of pixel units, thus resulting in abnormal display, or, the time used for touch scanning is too long, thus resulting in abnormal touch.

Common capacitive touch screens can be divided into two types: self-capacitance touch screen and mutual capacitance touch screen. Each touch unit in the self-capacitance touch screen needs to be connected with an independent signal line. The mutual capacitance touch screen needs a separate timing control circuit configured to drive multiple rows of touch units. The timing control circuit needs to provide a driving signal to each row touch unit. For example, the timing control circuit can be provided in a driving chip of a display device, for example, the timing control circuit can be implemented as a timing logic unit in the driving chip.

At least one embodiment of the present disclosure provides a shift register circuit, which includes P shift registers that are cascaded and a bypass output circuit, wherein each of the P shift registers includes a first scan output terminal, the first scan output terminal is configured to output a first scan signal, the bypass output circuit includes Q control terminals and a second scan output, the Q control terminals of the bypass output circuit are configured to receive the first scan signal, and the bypass output circuit is configured to output a second scan signal under control of the first scan signal received by the Q control terminals respectively, P is an integer greater than or equal to 2, and Q is an integer less than or equal to P.

Some embodiments of the present disclosure also provide a driving circuit, a display device and a driving method corresponding to the above shift register circuit.

The shift register circuit, the driving circuit, the display device and the driving method provided by the embodiments of the present disclosure can also scan and drive the touch units during at least part of time of scanning and driving pixel units, which can simplify driving modes of display scanning and touch scanning of a display device adopting TDDI technology, so that the driving chip configured for the display device can save the timing logic unit, thereby reducing the cost, increasing the charging time of the pixel units PU, and improving the display quality.

The shift register circuit, the driving circuit, the display device and the driving method of the embodiments of the present disclosure will be described in detail below in combination with the accompanying drawings.

Some embodiments of the present disclosure provide a shift register circuit 100, as shown in FIG. 1A, which includes P shift registers 110 that are cascaded and a bypass output circuit 120, P is an integer greater than or equal to 2. For example, the driving circuit composed of a plurality of shift register circuits 100 that are cascaded may be configured to drive a display panel to perform display scanning and touch scanning.

For example, each of the P shift registers 110 includes a first scan output terminal ST1, and the first scan output terminal ST1 is configured to output a first scan signal.

Figure 1B:
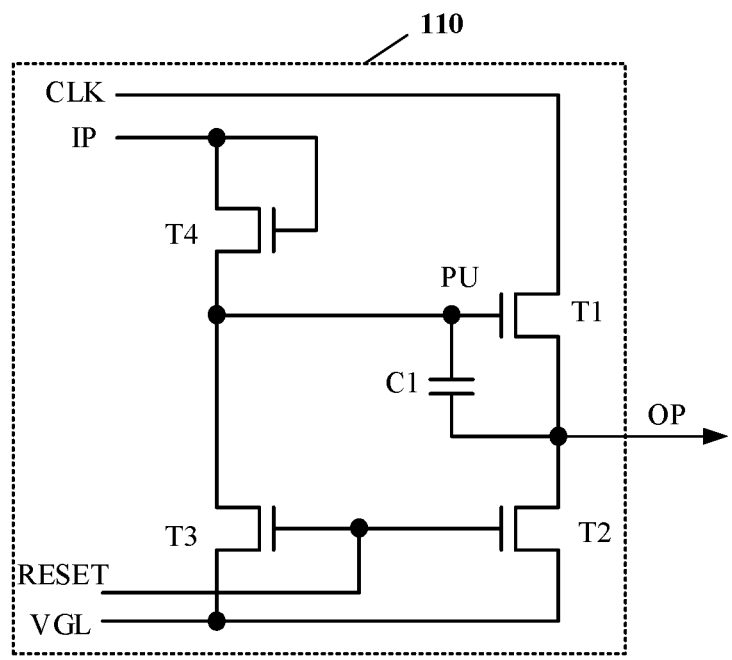
FIG. 1B is a circuit structural diagram of a shift register.

FIG. 1B is a circuit structural diagram of an exemplary shift register 110, as shown in FIG. 1B, the shift register 110 includes a first transistor T1, a second transistor T2, a third transistor T3, a fourth transistor T4, and a storage capacitor C1.

The first transistor T1 in the shift register 110 is an output transistor of the shift register 110. For example, a first electrode of the first transistor T1 receives a clock signal CLK, and a second electrode of the first transistor T1 is connected with a first electrode of the second transistor T2 to obtain the output terminal OP of the shift register 110. When the first transistor T1 is turned on, the received clock signal can be output as an output signal from the output terminal OP, and the output signal can be used to drive and scan pixel units (for example, the output signal is a row-by-row scan signal). A gate electrode of the first transistor T1 is connected with a pull-up node PU, thereby connecting a first electrode of the third transistor T3 and a second electrode of the fourth transistor T4.

A second electrode of the second transistor T2 is connected with a second electrode of the third transistor T3 and a low-level signal VGL. A gate electrode of the second transistor T2 is connected with a reset terminal RESET to receive a reset signal. The first electrode of the second transistor T2 is connected with the second electrode of the first transistor T1, so that the second transistor T2 can be turned on under control of the reset signal. When the first transistor T1 does not need to output, the output terminal OP is pulled down to the low-level signal VGL.

A first electrode of the third transistor T3 is also connected with the pull-up node PU, thereby electrically connected with the second electrode of the fourth transistor T4 and the gate electrode of the first transistor T1. The second electrode of the third transistor T3 is connected with the low-level signal VGL. A gate electrode of the third transistor T3 is also connected with the reset terminal reset RESET to receive the reset signal, so that the pull-up node PU can be turned on under control of the reset signal, and the pull-up node PU can be reset to the low-level signal VGL to turn off the first transistor T1.

A first electrode of the fourth transistor T4 is connected with a gate electrode of itself and serves as an input terminal IP, and the input terminal IP receives an input signal. The second electrode of the fourth transistor T4 is connected with the pull-up node PU, so that when the fourth transistor T4 is turned on, the pull-up node PU can be charged, and the potential of the pull-up node PU can turn on the first transistor T1, thereby outputting the clock signal CLK through the output terminal OP. One terminal of the storage capacitor C1 is connected with the gate electrode of the first transistor T1, that is, the pull-up node PU, and the other terminal is connected with the second electrode of the first transistor T1, so that the level of the pull-up node PU can be stored, and the level of the pull-up node PU can be continuously pulled up through the bootstrap effect of itself, when the first transistor T1 is turned on, to improve the output performance.

When the plurality of shift registers 110, as shown in FIG. 1B, are cascaded, the input terminal IP of a shift register 110 of a current stage can be connected with the output terminal OP of a shift register 110 of a previous stage, so that the output signal of the shift register 110 of the previous stage can be received and used as the input signal of the shift register 110 of the current stage. The reset terminal RESET of the shift register 110 of the current stage can be connected with the output terminal OP of a shift register 110 of a next stage, so that the output signal of the shift register 110 of the next stage can be received and used as the reset signal of the shift register 110 of the current stage.

It should be noted that in each embodiment of the present disclosure, the structure of shift register 110 is not limited to the circuit structure as shown in FIG. 1B, the shift register 110 can be any applicable structure, and can also include more or less transistors and/or capacitors, such as adding sub circuits for realizing functions of pull-up node control, pull-down node control, noise reduction, etc. the embodiments of the present disclosure do not limit this.

For example, as shown in FIG. 1A, the bypass output circuit 120 includes P control terminals CT and a second scan output terminal ST2. The P control terminals CT of the bypass output circuit 120 are respectively connected with the P first scan output terminals ST1 of the P shift registers 110 to receive the P first scan signals output by the P first scan output terminals ST1 of the P shift registers 110, and the bypass output circuit 120 is configured to output a second scan signal under control of the P first scan signals received by the P control terminals CT.

Figure 1C:
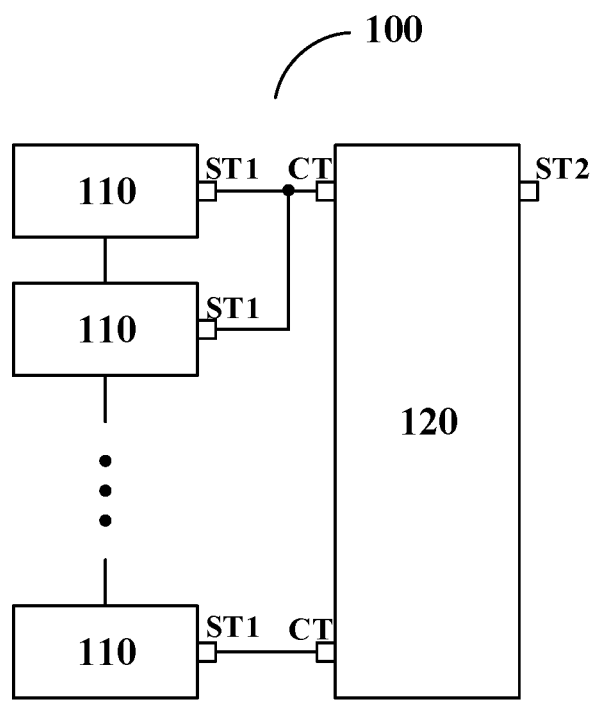
FIG. 1C is a schematic diagram of another shift register circuit according to some embodiments of the present disclosure.

For example, as shown in FIG. 1C, in some other embodiments of the present disclosure, a bypass output circuit 120 includes Q control terminals CT and a second output terminal ST2. For example, Q is an integer less than P. For example, as shown in FIG. 1C, the same control terminal CT can be connected with the first scan output terminals ST1 of different shift registers 110, that is, different first scan output terminals ST1 can be connected with the same control terminal CT.

Figure 1D:
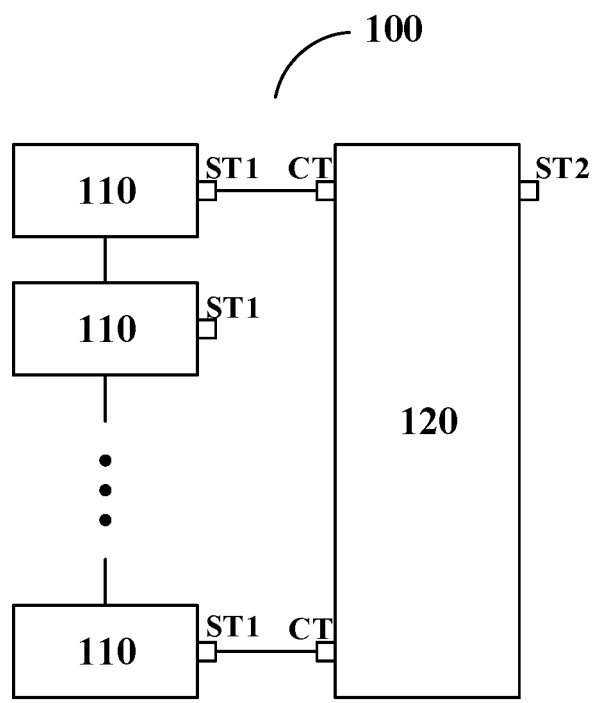
FIG. 1D is a schematic diagram of still another shift register circuit according to some embodiments of the present disclosure.

For another example, as shown in FIG. 1D, in some other embodiments of the present disclosure, a bypass output circuit 120 includes Q control terminals CT and a second output terminal ST2. For example, Q is an integer less than P. For example, as shown in FIG. 1D, when the amount of the control terminals CT of the bypass output circuit 120 is less than the amount of the first scan output terminals ST1, one or more of the first scan output terminals ST1 may not be connected with the control terminal CT.

Figure 2:
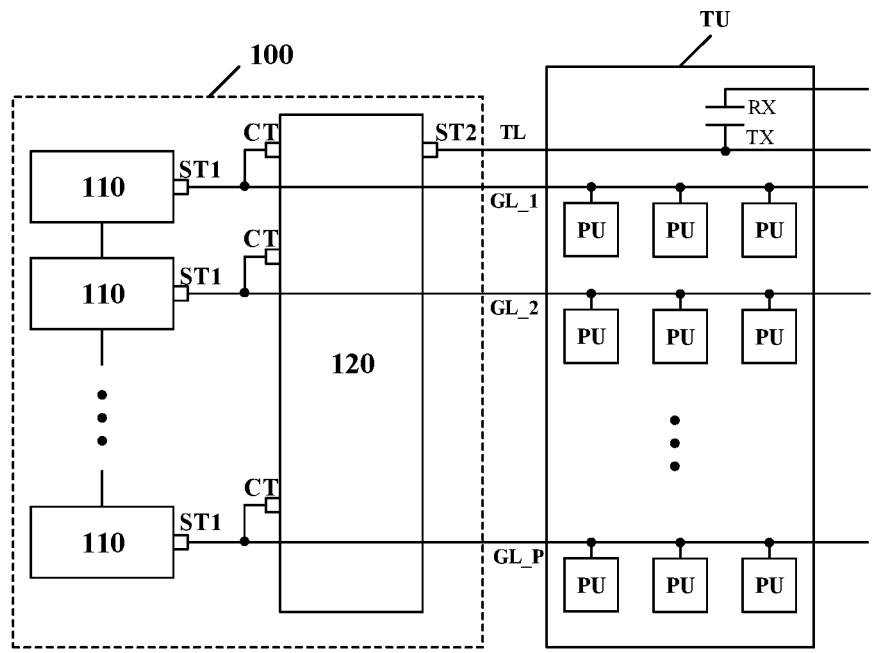
FIG. 2 is a schematic diagram of using the shift register circuit as shown in FIG. 1A to drive pixel units and touch units in a display panel.

As shown in FIG. 2, the above shift register circuit 100 according to the embodiments of the present disclosure can be configured to drive the pixel units PU and the touch units TU in the display panel. For example, the first scan output terminal ST1 of each of the shift registers 110 may be connected with a row of pixel units PU in the display panel through a gate line (for example, GL_1, GL_2 . . . GL_3), so that the first scan signal can be provided to the row of pixel units PU. For example, the first scan signal may be a scan signal for turning on the multiple rows of pixel units PU row-by-row, and the pixel units PU in the display panel (for example, P rows of pixel units PU as shown in FIG. 2) may receive corresponding data voltage (Vdata) when it is turned on, thereby charging the pixel units PU (by data voltage writing).

For example, as shown in FIG. 2, the second scan output terminal ST2 of the bypass output circuit 120 can be connected with a row of touch units TU through a touch drive line TL, for example, connected with the touch driving electrode TX in the touch units TU, so that the second scan signal can be supplied to the row of touch units TU. For example, the second scan signal can charge the touch driving electrode TX in the row of touch units TU. For example, touch scanning can be implemented by detecting signal changes (such as current signals, voltage signals, etc.) of a plurality of touch sensing electrodes RX corresponding to the touch driving electrode TX in the row of touch units TU.

For example, as shown in FIG. 2, because the P control terminals CT of the bypass output circuit 120 are respectively connected with the P first scan output terminals ST1 of the P shift registers 110, when any one of the P shift registers 110 outputs a first scan signal, the bypass output circuit 120 can receive the corresponding first scan signal. For example, the bypass output circuit 120 may be configured to receive a touch clock signal. For example, the bypass output circuit 120 may be turned on under control of any one of received first scan signals, thereby outputting the received touch clock signal as a second scan signal.

It should be noted that the shift register circuit 100 as shown in FIG. 2 is schematically illustrated adopting the shift register circuit in FIG. 1A, the embodiments of the present disclosure include but are not limited to the above. The shift register circuit 100 as shown in FIG. 2 can also adopt the shift register circuit as shown in FIG. 1C or FIG. 1D.

The shift register circuit 100 provided by some embodiments of the present disclosure can also output the second scan signal at least in part of time of outputting the first scan signal, so that the touch units TU can also be scanned and driven during at least part of time of scanning and driving the pixel units PU, which can simplify the driving modes of the display scanning and the touch scanning of the display device adopting TDDI technology, so that the driving chip configured for the display device can save the timing logic unit, thereby reducing the cost, increasing the charging time of the pixel units PU, and improving the display quality.

It should be noted that the amount of pixel units PU shown in FIG. 2 is only schematic, and the embodiments of the present disclosure include but are not limited to the above. Specifically, FIG. 2 only shows one touch unit TU in one row, but the embodiments of the present disclosure are not limited to the above, and there can be a plurality of touch units TU in one row. Moreover, FIG. 2 shows one touch unit TU corresponding to P rows and three columns of pixel units PU, but the embodiments of the present disclosure are not limited to this, and one touch unit TU can also correspond to two columns, four columns or more columns of pixel units PU. In addition, in FIG. 2, two electrodes of a capacitor, which is adopted, are used to represent the touch driving electrode TX and the touch sensing electrode Rx, respectively, the capacitance here is schematic for explaining the embodiments of the present disclosure, and does not represent the true structure. The shape of the touch unit TU shown in FIG. 2 is rectangular, the embodiments of the present disclosure include but are not limited to the above, the shape of the touch unit TU can also be other shapes, such as rhombus, etc.

Figure 3A:
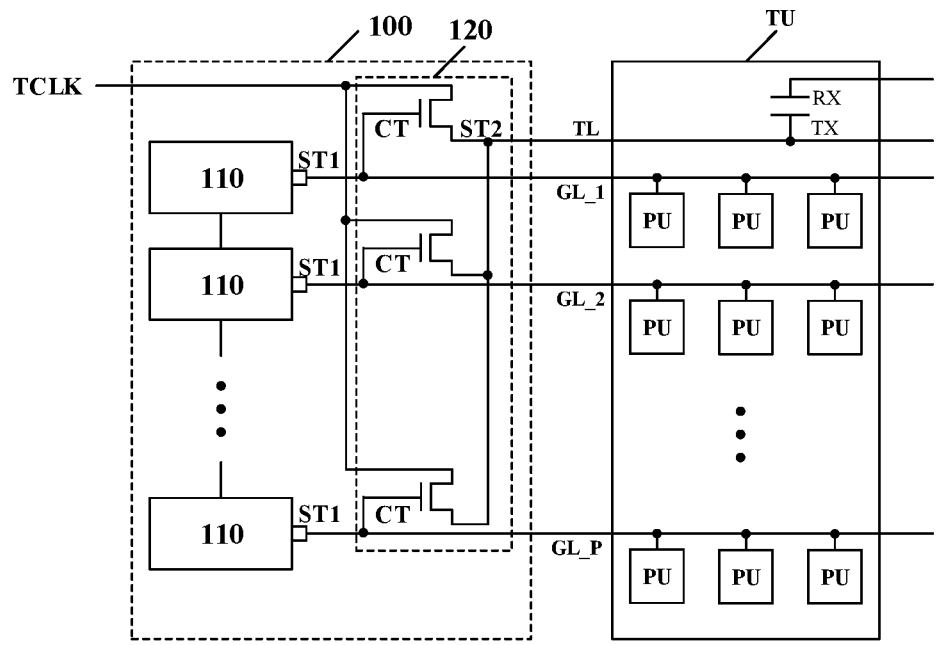
FIG. 3A is a schematic diagram of a bypass output circuit that is implemented by transistors.

As shown in FIG. 3A, in the shift register circuit 100 provided by some embodiments of the present disclosure, the bypass output circuit 120 includes P transistors, P gate electrodes of the P transistors respectively serve as the P control terminals CT of the bypass output circuit 120, P first electrodes of the P transistors are connected with each other and serve as the second scan output terminal ST2, and the second scan output terminal ST2 is configured to output the second scan signal.

For example, as shown in FIG. 3A, in one example, P second electrodes of the P transistors are connected with each other, and configured to receive the same touch clock signal TCLK. When one or more of the P transistors are turned on, the transistor or transistors being turned on can output the touch clock signal TCLK as the second scan signal.

For example, as shown in FIG. 3A, the P transistors are all N-type transistors, and for example, a first electrode of a transistor is a drain electrode, and a second electrode is a source electrode. When the first scan signal output by any one of the shift registers 110 is a high level, the high level can control the bypass output circuit 120 to turn on the transistors correspondingly connected with the shift register 110, so that the transistors that are turned on can output the touch clock signal TCLK as the second scan signal at the second scan output terminal ST2.

For example, when the first scan signal output by the P shift registers 110 that are cascaded is a row-by-row scan signal, that is, only one of the P first scan output terminals ST1 is at a high level at the same time, only one of the P transistors in the bypass output circuit 120 is in a turn on state at the same time, and the transistor that is turned on can output the touch clock signal TCLK as the second scan signal from the second scan output ST2. For example, when the first scan signal output by the P shift registers 110 that are cascaded is an interlaced scan signal, two of the first scan output terminals ST1 are at a high level at the same time, then two transistors in the bypass output circuit 120 are in the turn on state at the same time, and the two transistors that are turned on can output the touch clock signal TCLK as the second scan signal from the second scan output ST2. The embodiments of the present disclosure do not limit the specific form of the first scan signal.

Figure 3B:
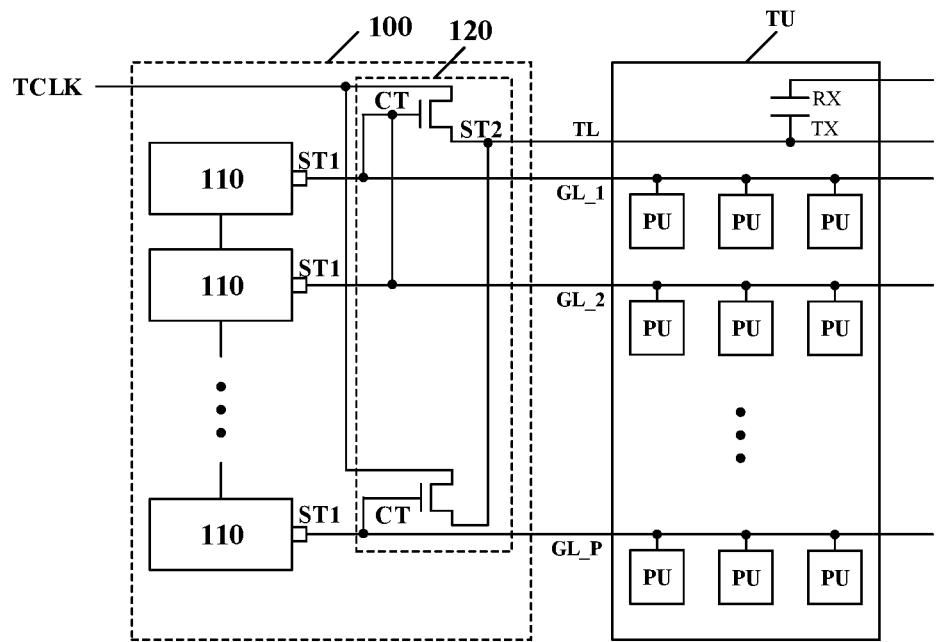
FIG. 3B is another schematic diagram of a bypass output circuit that is implemented by transistors.

For example, as shown in FIG. 3B, in other embodiments, the bypass output circuit 120 includes Q transistors, Q is an integer less than or equal to P. For example, as shown in FIG. 3B, the first scan output ST1 of the shift register 110 of a first stage and the first scan output ST1 of the shift register 110 of a second stage can be connected with the same control terminal CT of the bypass output circuit 120 at the same time.

Figure 3C:
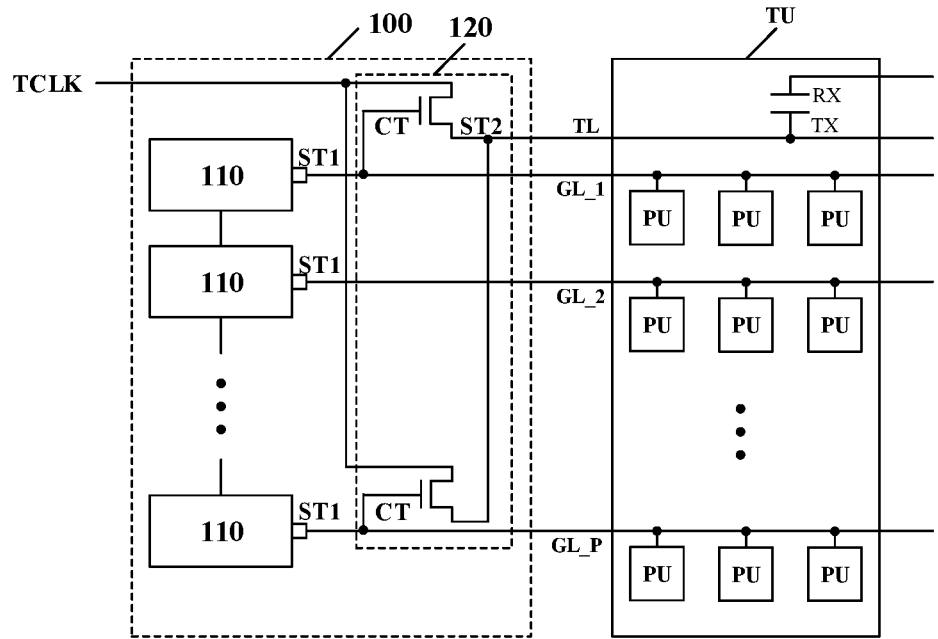
FIG. 3C is still another schematic diagram of a bypass output circuit that is implemented by transistors.

For example, as shown in FIG. 3C, in other embodiments, the bypass output circuit 120 includes Q transistors, Q is an integer less than or equal to P. For example, when the amount of control terminals CT of the bypass output circuit 120 is less than the amount of the first scan output terminals ST1, one or more first scan output terminals ST1 may not be connected with the control terminals CT. For example, as shown in FIG. 3C, the first scan output ST1 of the shift register 110 of the second stage is not connected with the control terminals CT of the bypass output circuit 120.

Figure 4:
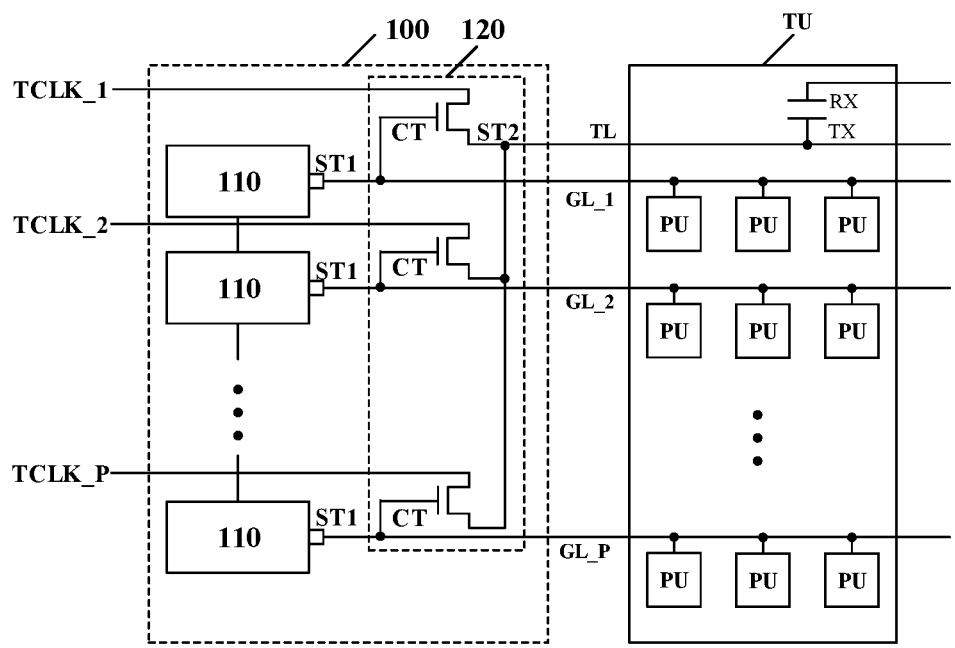
FIG. 4 is still another schematic diagram of a bypass output circuit that is implemented by transistors.

For example, as shown in FIG. 4, in other embodiments, P second electrodes of P transistors respectively receive different touch clock signals (for example, TCLK_1, TCLK_2 . . . TCLK_P), when one or more of the P transistors are turned on, the transistor or transistors being turned on can output the received touch clock signal TCLK as the second scan signal.

The touch clock signal in FIG. 4 is described below in combination with FIG. 5-FIG. 7. It should be noted that SCAN1 in FIG. 5-FIG. 7 represents the first scan signal output by one of the shift registers 110, the first scan signal SCAN1 output by the shift register 110 of the first stage and the touch clock signal TCLK_1 received by a first transistor are described as examples below, and the following embodiment will not be described in detail.

Figure 5:
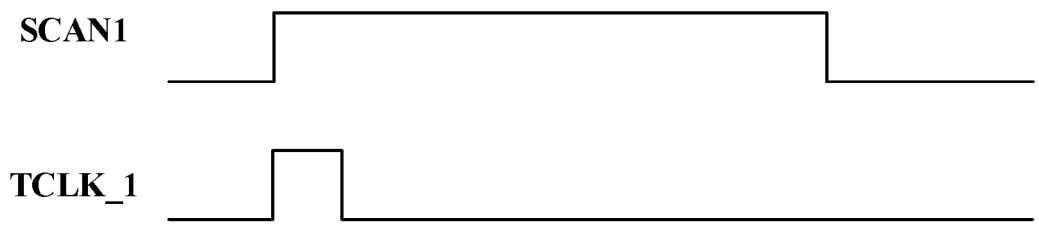
FIG. 5 is a signal timing diagram of a first scan signal and a touch clock signal.

In some embodiments, as shown in FIG. 4 and FIG. 5, the rising edge of the touch clock signal TCLK_1 is consistent with the rising edge of the first scan signal SCAN1. For example, the pulse width of the touch clock signal TCLK_1 is less than the pulse width of the first scan signal SCAN1, for example, in one example, the pulse width of the touch clock signal TCLK_1 is $\frac{1}{10}$ of the pulse width of the first scan signal SCAN1. The embodiments of the present disclosure include but not limit to the above, relationship between the pulse width of the touch clock signal TCLK_1 and the pulse width of the first scan signal SCAN1 can be set according to actual situation.

Figure 6:
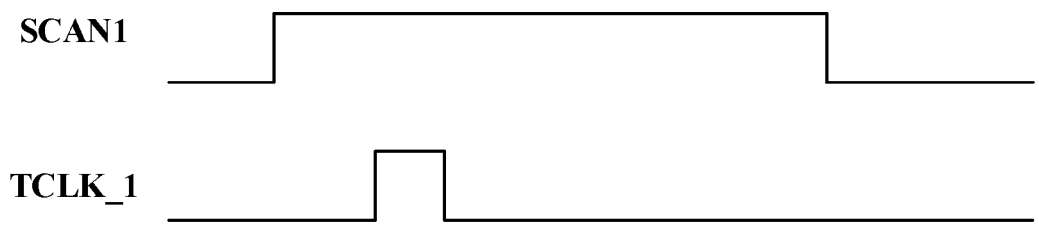
FIG. 6 is another signal timing diagram of a first scan signal and a touch clock signal.

In other embodiments, as shown in FIG. 4 and FIG. 6, the rising edge of the touch clock signal TCLK_1 may also be later than the rising edge of the first scan signal SCAN1. Embodiments of the present disclosure include but not limit to cases as shown in FIG. 5 and FIG. 6, as long as a time period when the touch clock signal TCLK_1 is at an effective level (for example, a high level) is within the time period when the first scan signal SCAN1 is at an effective level (for example, a high level).

Figure 7:
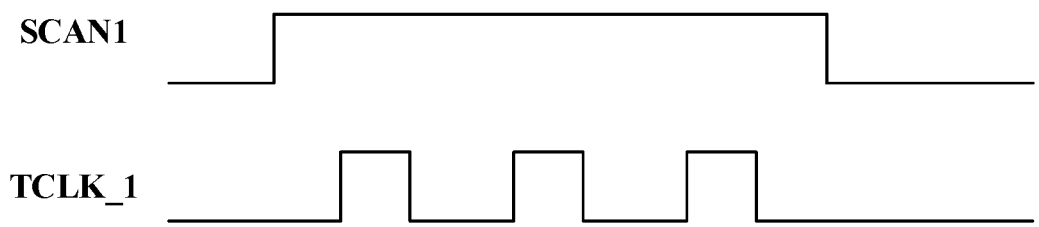
FIG. 7 is still another signal timing diagram of a first scan signal and a touch clock signal.

In other embodiments, as shown in FIG. 4 and FIG. 7, one pulse of the first scan signal SCAN1 includes pulses of three touch clock signals TCLK_1, that is, in the time when the shift register circuit 100 performs display scanning on one row of pixel units PU, the shift register circuit 100 performs three charging operations on one row of touch units TU connected with the shift register circuit 100. Compared with examples in FIG. 5 and FIG. 6, an example in FIG. 7 can improve the charging efficiency of the touch units TU, thereby improving the sensitivity of the touch scanning and the touch point reporting rate.

It should be noted that the transistors used in the embodiments of the present disclosure can be thin-film transistors or field-effect transistors or other switching devices with the same characteristics, and thin-film transistors are used as examples in the embodiments of the present disclosure. Source electrodes of the transistors and drain electrodes of the transistors used herein can be symmetrical in structure, therefore there is no difference in structure between the source electrodes of the transistors and the drain electrodes of the transistors. In the embodiments of the present disclosure, in order to distinguish two electrodes of a transistor other than a gate electrode, one electrode is directly described as the first electrode, and the other electrode is described as the second electrode.

In addition, the transistors in the embodiments of the present disclosure are all illustrated by taking N-type transistors as examples. In this case, the first electrode can be the drain electrode, and the second electrode can be the source electrode. It should be noted that the embodiments of the present disclosure are not limited to this. For example, when switch transistors in the pixel units PU are P-type transistors, the transistors in the bypass output circuit 120 in the shift register circuit 100 provided by the embodiments of the present disclosure can also be P-type transistors, in this case, the first electrode can be the source electrode, the second electrode can be the drain electrode, it is only necessary to connect polarities of each electrode of the transistors of the selected type according to polarities of each electrode of the corresponding transistors in the embodiments of the present disclosure. Or, when the switching transistors in the pixel units PU are N-type transistors, the shift register circuit 100 provided by the embodiments of the present disclosure also includes a reverse circuit connected between the shift register 110 and the bypass output circuit 120, and the transistors of the bypass output circuit 120 can also be P-type transistors, the reverse circuit inverts the first scan signal and supplies it to the control terminals CT of the bypass output circuit 120.

Figure 8:
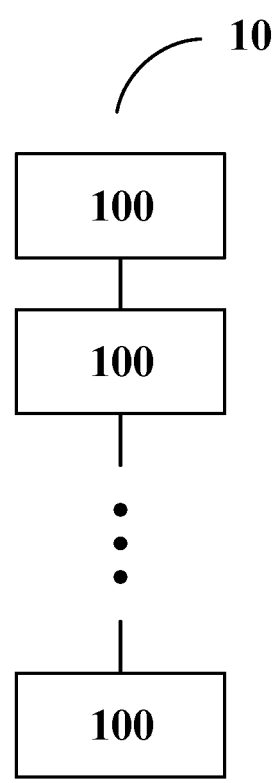
FIG. 8 is a schematic diagram of a driving circuit according to some embodiments of the present disclosure.

Some embodiments of the present disclosure also provide a driving circuit 10, as shown in FIG. 8, the driving circuit 10 includes a plurality of the shift register circuits 100 that are cascaded, and for example, the shift register circuit 100 may adopt any one of the shift register circuits 100 provided in the above embodiments.

For example, when the plurality of shift register circuits 100 are cascaded, the output terminal of the last shift register 110 of an m-th stage shift register circuit 100 is connected with the input terminal of the first shift register 110 of an (m+1)-th stage shift register circuit 100. The reset terminal of the last shift register 110 of the m-th stage shift register circuit 100 is connected with the output terminal of the first shift register of the (m+1)-th stage shift register circuit 100, and m is an integer greater than or equal to 1.

Figure 9:
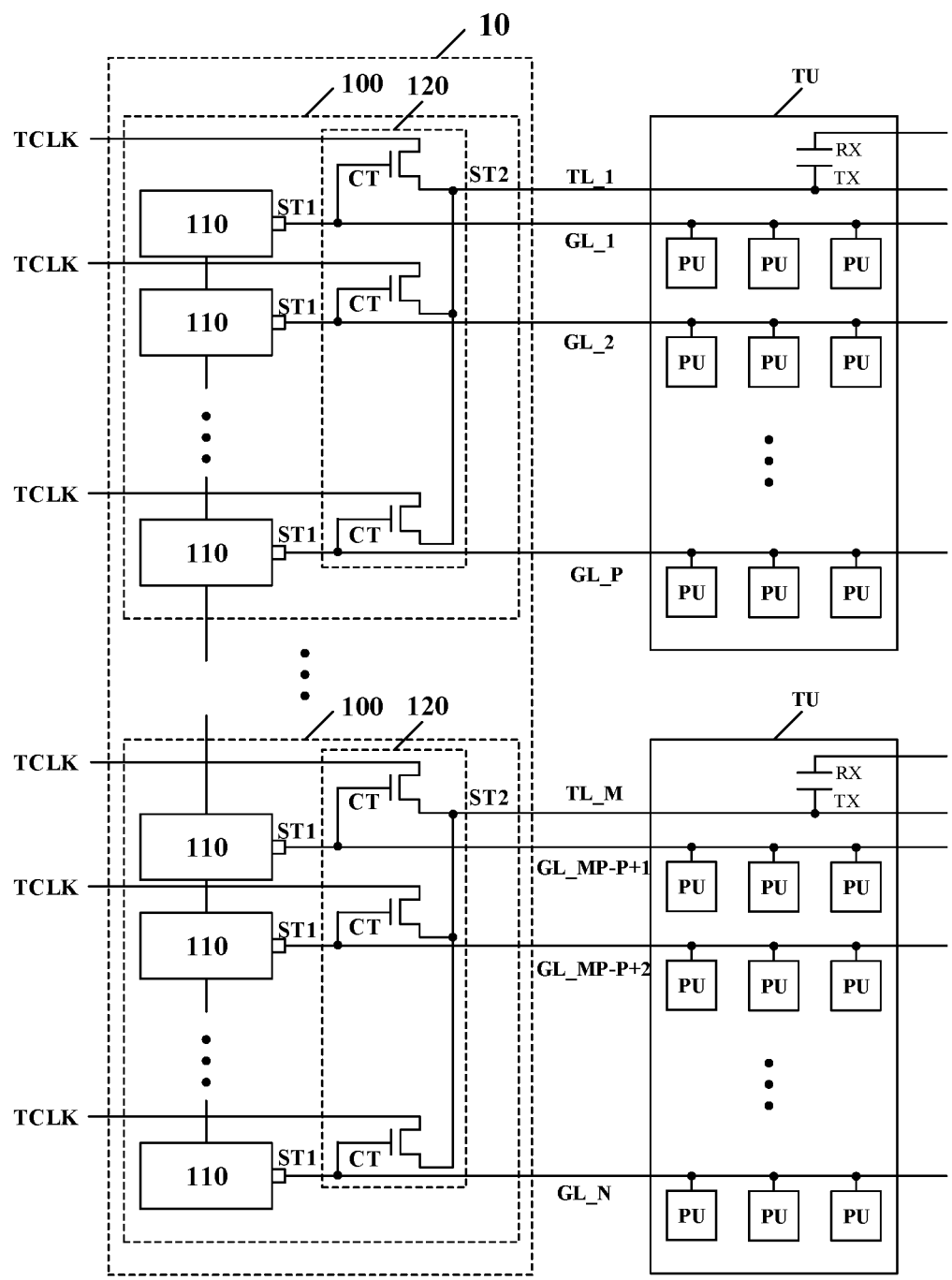
FIG. 9 is a schematic diagram of using the driving circuit as shown in FIG. 8 to drive pixel units and touch units in a display panel.

For example, the driving circuit 10 as shown in FIG. 8 can be implemented as the circuit structure in FIG. 9 to illustrate the driving principle of the driving circuit 10 to the display panel, and FIG. 9 also shows N rows of pixel units PU and M rows of touch units TU in the display panel.

For example, as shown in FIG. 9, the driving circuit 10 is connected with the N rows of pixel units PU through N gate lines, and the first scan signal (for example, the row-by-row scan signal) output by the driving circuit 10 is used to drive the N rows of pixel units PU to perform the display scanning. The driving circuit 10 is connected with the M rows of touch units TU through M touch driving lines (TL_1 ... TL_M), during at least part of time when the driving circuit 10 outputs the first scan signal, the driving circuit 10 can also output the second scan signal to drive the M rows of touch units TU.

It should be noted that only three columns of pixel units PU and one column of touch units TU are schematically shown in FIG. 9, the embodiments of the present disclosure include but are not limited to the above, the amount of pixel units PU and the amount of touch units TU can be set according to the actual situation.

The driving circuit 10 provided by embodiments of the present disclosure can also scan and drive the touch units TU during at least part of the time of scanning and driving the pixel units PU, which can simplify the driving modes of the display scanning and the touch scanning of the display device adopting TDDI technology, so that the driving chip for the display device can save the timing logic unit, thereby reducing the cost, increasing the charging time of the pixel units, and improving the display quality.

Figure 10A:
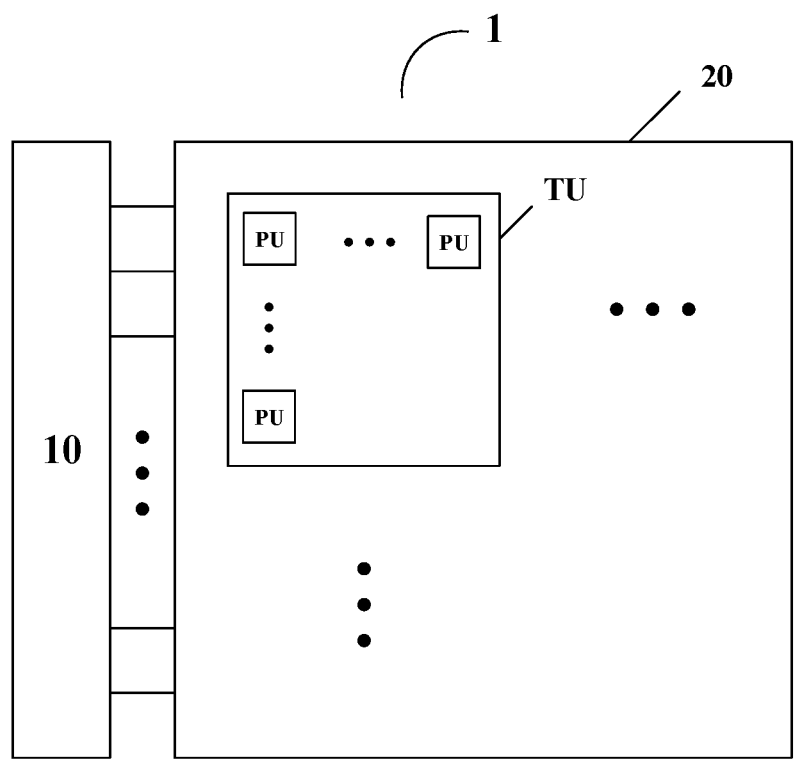
FIG. 10A is a schematic diagram of a display device according to some embodiments of the present disclosure.

Some embodiments of the present disclosure also provide a display device 1, as shown in FIG. 10A, the display device 1 includes a driving circuit 10 and a display panel 20, the display panel 20 includes a display array and a touch array. For example, the driving circuit 10 may adopt the driving circuit 10 as shown in FIG. 9. It should be noted that the display panel 20 in FIG. 10A only schematically shows part of the pixel units PU and one touch unit TU, the display device 1 provided by the embodiments of the present disclosure does not limit the amount of the pixel units PU and the amount of the touch units TU.

Figure 10B:
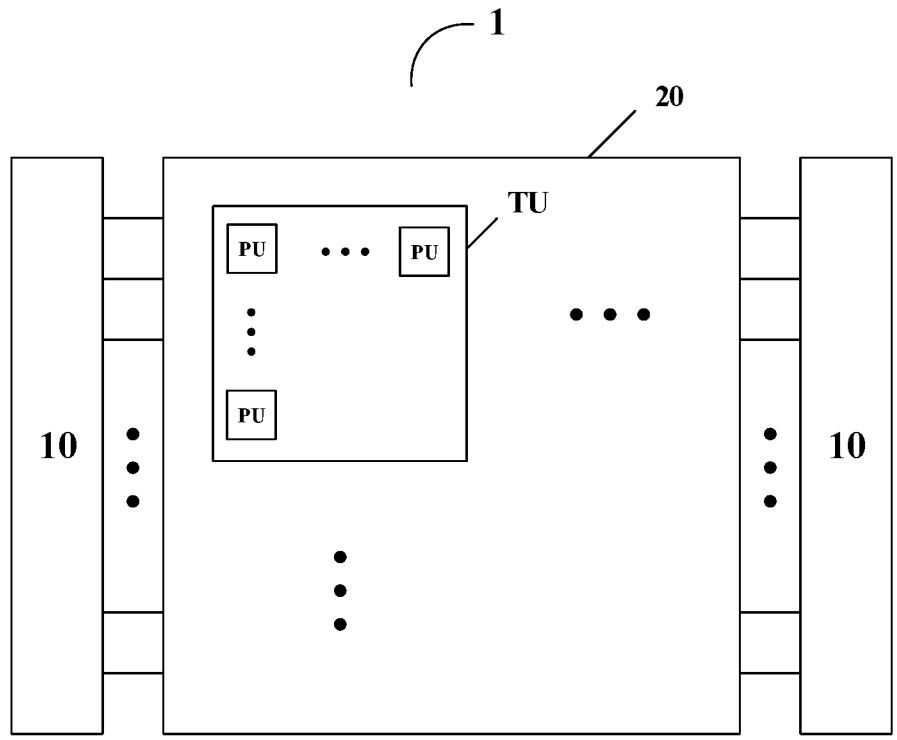
FIG. 10B is a schematic diagram of another display device according to some embodiments of the present disclosure.

Embodiments of the present disclosure also provides the display device 1 as shown in FIG. 10B, in which driving circuits 10 are arranged on both sides of the display panel 20. For example, the driving circuit 10 as shown in FIG. 9 can be adopted for the driving circuit 10 on the both sides. For another example, the driving circuit 10 on one side may include only the shift registers 110 that are cascaded, and not the bypass output circuits 120 that are cascaded.

For example, the display device 1 can be any product or component with display function, such as a mobile phone, a tablet computer, a television, a displayer, an notebook computer, a digital photo frame, an navigator, etc.

It should be noted that the embodiments of the present disclosure are not limit to the type of display device 1, and may include, for example, an LCD display panel, an OLED display panel, or an electronic paper display panel.

The display device 1 provided by the embodiments of the present disclosure can also scan and drive the touch units TU during at least part of the time of scanning and driving the pixel units PU, which can simplify the driving modes of the display scanning and the touch scanning of the display device, so that the driving chip configured for the display device 1 can save the timing logic unit, thereby reducing the cost, increasing the charging time of the pixel units, and improving the display quality.

Figure 12:
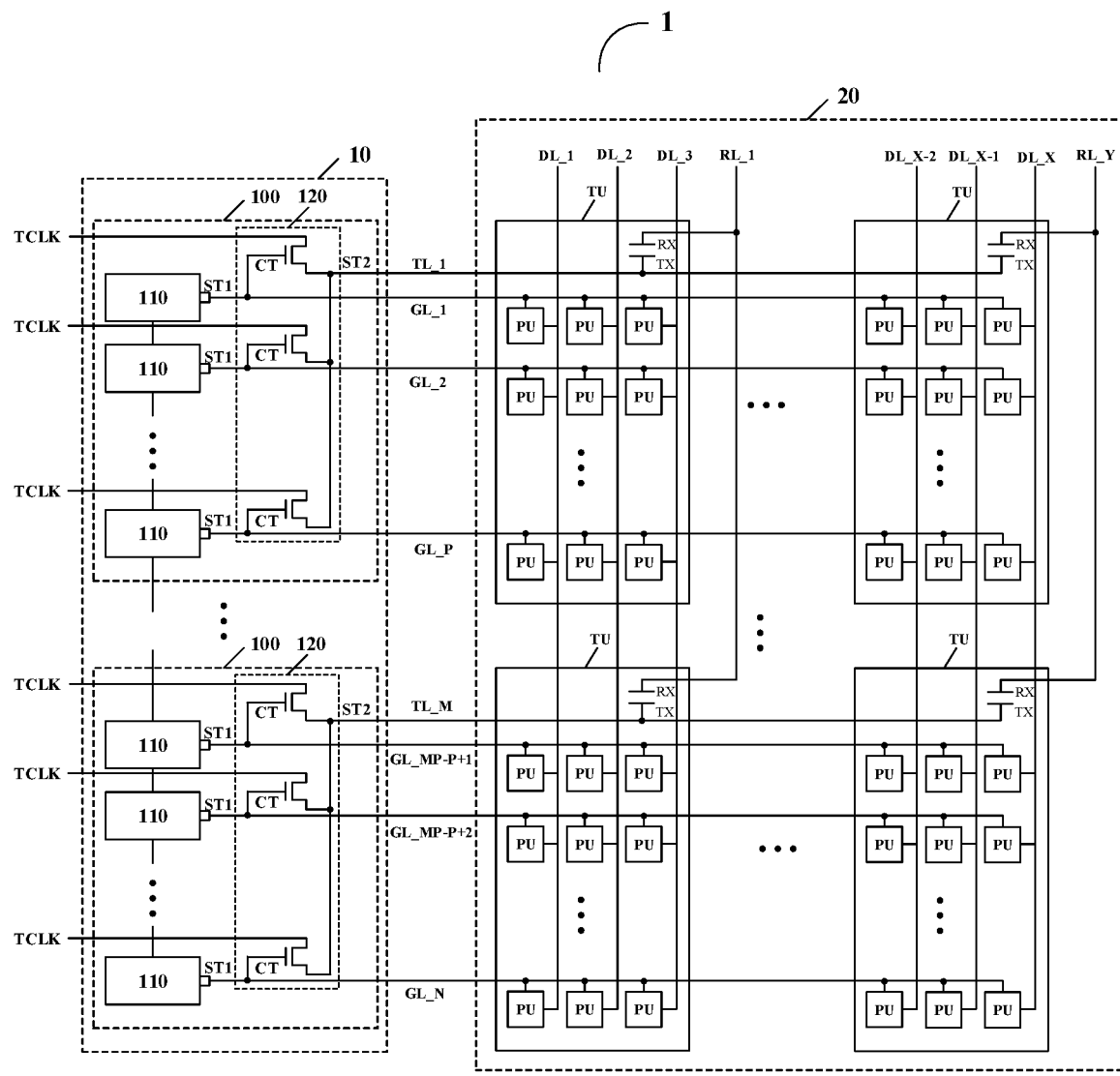
FIG. 12 is a schematic diagram of still another display device according to some embodiments of the present disclosure.

The display device 1 in FIG. 10A can be implemented as the circuit structure in FIG. 12. As shown in FIG. 12, the display array in the display panel 20 includes N rows and X columns of pixel units PU, the touch array includes M rows and Y columns of touch units TU, and the driving circuit 10 includes M shift register circuits 100 that are cascaded. Each of the shift register circuits 100 includes P cascaded shift registers 110, N and M are integers greater than or equal to 2, and N=M*P.

In some embodiments of the present disclosure, the display panel 20 in the display device 1 can be various types of display panels, such as an LCD panel, an OLED display panel, etc., and the touch array including touch units can be combined with the display array including pixel units in various appropriate ways, for example, an on-cell (external) touch display structure or in-cell (embedded) touch display structure can be formed.

Figure 11A:
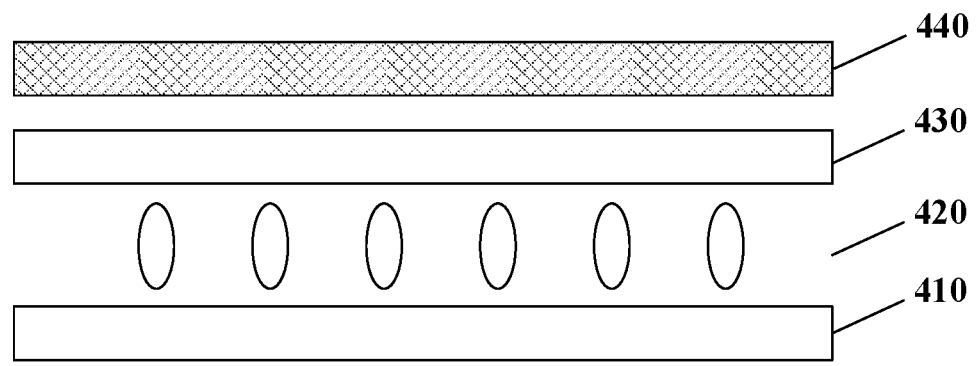
FIG. 11A is a structural schematic diagram of a display panel in a display device according to some embodiments of the present disclosure.
Figure 11B:
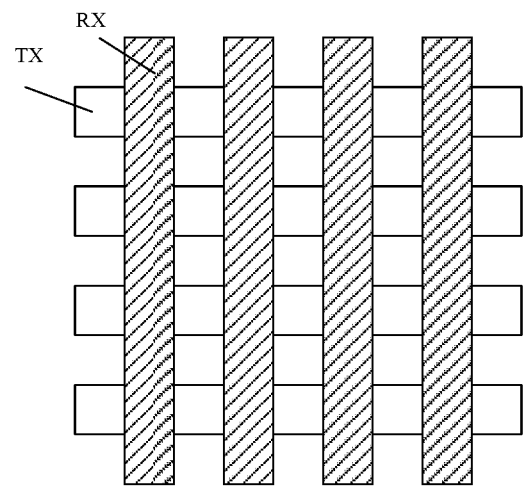
FIG. 11B is a schematic plan view of a structure of a touch array layer.
Figure 11C:
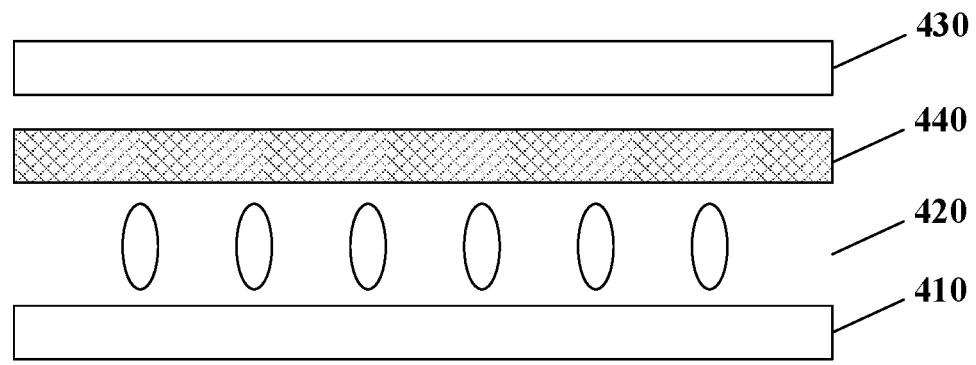
FIG. 11C is another structural schematic diagram of a display panel in a display device according to some embodiments of the present disclosure.

For example, when the display panel 20 in the display device 1 provided by some embodiments of the present disclosure adopts an LCD display panel, FIG. 11a and FIG. 11C show two kinds of structural schematic diagrams of a display array layer (the layer where the display array is located) and a touch array layer (the layer where the touch array is located) in the display panel.

For example, in one example, as shown in FIG. 11A, the display panel 20 may adopt an on-cell structure. For example, the display panel may include an array substrate 410, a liquid crystal layer 420, and an counter substrate 430, a plurality of gate lines and a plurality of data lines are arranged in the array substrate 410, the plurality of gate lines and the plurality of data lines cross each other to define a plurality of pixel areas, and a pixel electrode and a thin film transistor electrically connected with the pixel electrode as a switching element are formed in each of the pixel areas. The counter substrate 430 is, for example, a color film substrate, including color film units (including, for example, red green blue (RGB) color film units) and black matrixes between the color film units. Thus, the pixel units includes the pixel areas on the array substrate and the color film units on the color film substrate. A touch array layer 440 is provided with a plurality of touch units TU. In the example shown in FIG. 11A, the touch array layer 440 is arranged on a side of the counter substrate 430 which faces away from the array substrate 410. For example, the driving circuit 10, etc., are formed on the array substrate, and, leads, for example, gate lines, data lines, touch drive electrodes, touch induction electrodes, etc., are also formed on the array substrate.

The touch array layer 440 may be of, for example, a mutual capacitance type. FIG. 11B is a schematic diagram of a touch array layer. In the example as shown in FIG. 11B, the touch array layer 440 includes a plurality of touch driving electrodes TX, which are parallel to each other, and a plurality of touch sensing electrodes RX, which are parallel to each other. For example, the touch driving electrodes TX and the touch sensing electrodes RX are respectively formed of transparent conductive materials (such as indium tin oxide), and are located in different layers relative to the counter substrate 430, and the touch driving electrodes TX and the touch sensing electrodes RX are separated by an insulating layer (not shown). The touch driving electrodes TX and the touch sensing electrodes RX cross each other to form a touch capacitance at each position where the touch driving electrodes TX and the touch sensing electrodes RX are overlapped with each other, that is, the touch control units TU. The touch function can be realized by detecting capacitance changes of touch capacitances due to, for example, proximity of a finger. The structure of the touch array layer 440 is not limited to the case as shown in FIG. 11B, and the embodiments of the present disclosure are not limit thereto.

For another example, in another example, as shown in FIG. 11C, the display panel 20 may also adopt an in-cell (embedded) structure. In an example as shown in FIG. 11C, the touch array layer 440 is arranged on a side of the counter substrate 430 facing the array substrate 410.

As shown in FIG. 11A and FIG. 11C, the touch array layer 440 in the display panel 20 covers the display array layer, and in a direction perpendicular to the panel surface of the display panel 20, one touch unit TU in the display panel 20 covers the plurality of pixel units PU. For example, the touch driving electrodes TX and the touch sensing electrodes RX are electrically connected with the corresponding leads formed on the array substrate through conductive spacers or other conductive parts, so that the touch driving electrodes TX are electrically connected with the driving circuit 10.

Figure 11D:
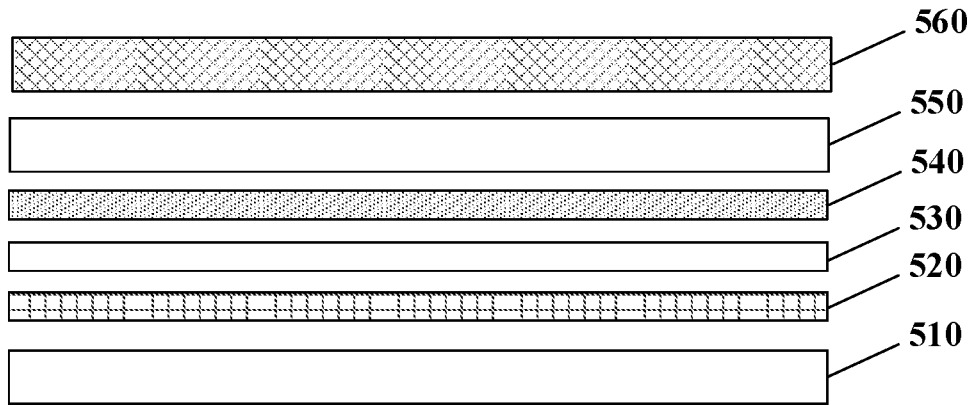
FIG. 11D is still another structural schematic diagram of a display panel in a display device according to some embodiments of the present disclosure.

For example, when the display panel 20 in the display device 1 provided by some embodiments of the present disclosure adopts an OLED display panel, FIG. 11D shows a structural diagram of the display panel.

For example, as shown in FIG. 11D, the display panel may include an array substrate 510, an anode layer 520 formed on the array substrate 510 configure to display, an organic light-emitting layer 530, a cathode layer 540, and a encapsulation layer 550. The plurality of gate lines and the plurality of data lines are arranged in the array substrate 510, and the plurality of gate lines and the plurality of data lines cross each other to define the plurality of pixel areas. For example, each of the pixel areas corresponds to a pixel unit, in the each of the pixel areas, and a thin film transistor electrically connected with the anode layer 520 and serving as a driving element is formed, in addition, the pixel areas may also include other components, such as switch transistors, storage capacitors, etc. The organic light-emitting layer 530 is electrically connected with the anode layer 520 and the cathode layer 540. The organic light-emitting layer 530 emits light under voltage driving of the anode layer 520 and the cathode layer 540. The encapsulation layer 550 may adopt, for example, encapsulation glass or an encapsulation film, which may be, for example, a composite encapsulation film, including laminated organic films, inorganic films, etc. For example, the driving circuit 10, etc., are formed on the array substrate, and the leads, for example, gate lines, data lines, touch drive electrodes, touch induction electrodes, etc., are also formed on the array substrate.

For example, a touch array layer 560 is formed on the encapsulation layer 550, and includes the plurality of touch units TU. For example, the touch array layer 560 may adopt the mutual capacitance structure in FIG. 11B. For example, the touch driving electrodes TX and the touch sensing electrodes RX are electrically connected with the corresponding leads formed on the array substrate, so that the touch driving electrodes TX are electrically connected with the driving circuit 10. In this example, similarly, the touch array layer in the display panel covers the display array layer, and in the direction perpendicular to the panel surface of the display panel, one touch unit TU in the display panel covers the plurality of pixel units PU.

For example, as shown in FIG. 12, the M bypass output circuits 120 in the driving circuit 10 and the M rows of touch units TU are connected one-to-one in correspondence; the N shift registers 110 in the driving circuit 10 and the N rows of pixel units PU are connected one-to-one in correspondence to output the first scan signal that turns on the N rows of pixel units PU row-by-row.

For example, during at least part of time when the N shift registers 110 output the first scan signal, the M bypass output circuits 120 also output the second scan signal to drive the M rows of touch units TU.

For example, as shown in FIG. 12, the display panel 20 in the display device 1 also includes M touch driving lines (TL_1 ... TL_M). An m-th touch drive line is connected with the second scan output terminal ST2 and an m-th row touch unit TU in an m-th stage shift register circuit 100, and an m-th touch drive line is configured to receive the second scan signal from the m-th stage shift register circuit 100, and transmit the second scan signal to the m-th row touch unit TU, m is an integer satisfying 1≤m≤M.

For example, the touch driving lines can be connected with the touch driving electrodes TX in the touch control units TU, so that the touch driving electrodes TX can be charged by using the second scan signal.

For example, as shown in FIG. 12, the display panel 20 in the display device 1 also includes a plurality of touch detection lines (RL_1 ... RL_Y), the amount of the plurality of touch detection lines is the same as the amount of columns (Y) of the M rows of touch units TU, and the plurality of touch detection lines are respectively connected with multiple columns of touch units TU (here is the Y columns of touch units), thereby receiving the touch detection signal generated by the multiple columns of touch units TU driven by the second scan signal. For example, the touch sensing electrodes RX located in the same column of touch units TU is connected with the same touch detection line. For example, when touch operation occurs, capacitance values between the touch driving electrodes TX and the touch sensing electrodes RX will change, thereby generating a touch detection signal. The touch detection signal can be a current signal or a voltage signal, and then the touch detection line can output the touch detection signal, for example, to the driving chip for further signal processing.

For example, as shown in FIG. 12, the display panel 20 in the display device 1 also includes N gate lines (GL_1 ... GL_2), the driving circuit 10 includes N shift registers 110 that are cascaded, an n-th gate line is connected with the first scan output ST1 of the n-th stage shift register 110 and the n-th row pixel unit PU, and the n-th gate line is configured to receive the first scan signal from an n-th row shift register 110 and transmit the first scan signal to the n-th row pixel unit PU, for example, transmitted to the switch transistors in the pixel units PU, n is an integer satisfying 1≤n≤N.

For example, as shown in FIG. 12, the display panel 20 in the display device 1 also includes a plurality of data lines (DL_1, DL_2 ... DL_X), the amount of the plurality of data lines is the same as the amount of columns (X) of N rows of pixel units. The plurality of data lines and the multiple columns of pixel units PU are connected one-to-one in correspondence, respectively, to provide data signals.

For example, when the driving circuit 10 transmits the first scan signal to pixel units PU of a first row through a gate line GL_1, the pixel units PU of the first-row is turned on, in this case, the corresponding data voltage (Vdata) is written to X pixel units PU in the pixel units PU of first row through X data lines, thereby realizing the display scanning of the pixel units PU of the first row. After the display scanning of the pixel units PU of the first row is completed, then pixel units PU of a second row are displayed and scanned, and so on, the N rows of pixel units PU in the display panel 20 is displayed and scanned row-by-row. The embodiments of the present disclosure include, but are not limited to, a row-by-row display scanning mode, for example, when high resolution is not required, multiple rows of pixel units PU can also be scanned at one time, and for example, two rows of pixel units PU can be scanned at one time.

Taking a row-by-row display scanning mode as an example, when any one of the first scan output terminals ST1 in the driving circuit 10 outputs the first scan signal, one of the plurality of transistors in the bypass output circuit 120 is always in the turn on state. The first scan signal, which is output can drive a row of pixel units PU. In this case, if the touch clock signal TCLK, which is inputted, is a high level, the second scan signal output by the driving circuit 10 is also a high level. The second scan signal at the high level can drive a row of touch units TU, so that the display device 1 can also drive the touch units TU during at least part of time of driving the pixel units PU, which can simplify driving modes of the display scanning and the touch scanning, so that the driving chip for the display device 1 can save the timing logic unit, thus reducing the cost.

Figure 13:
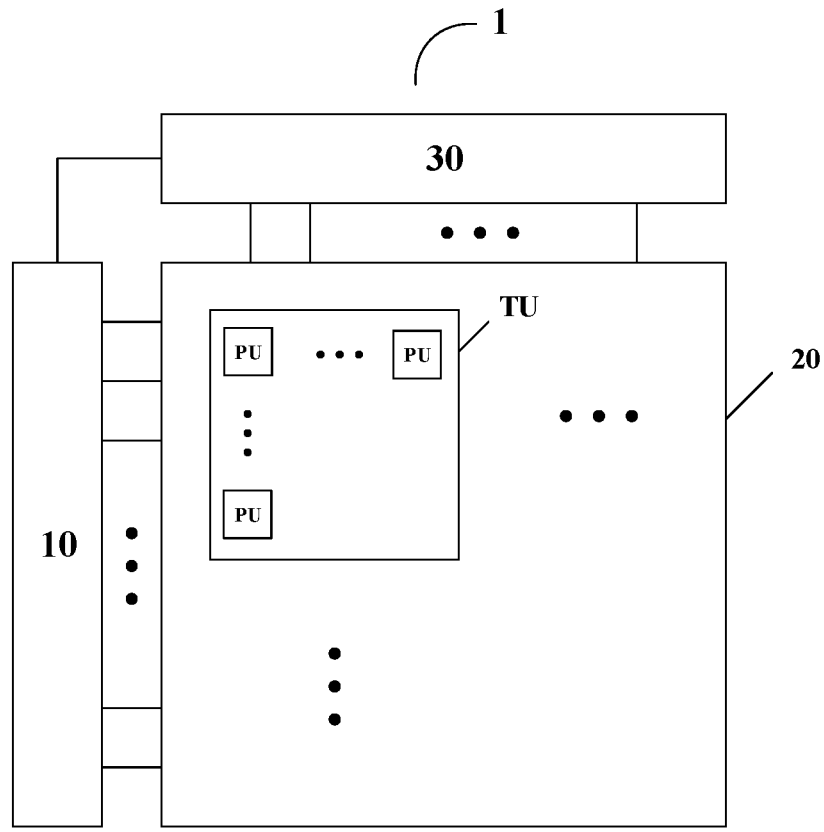
FIG. 13 is a schematic diagram of still another display device according to some embodiments of the present disclosure.

As shown in FIG. 13, the display device 1 provided by some embodiments of the present disclosure also includes a touch and display driver integrated (TDDI) chip 30, and the touch and display driver integrated chip 30 is configured to provide the touch clock signal TCLK for the driving circuit 10, and to receive the touch detection signal detected by the touch array.

For example, the touch and display driver integrated chip 30 and the touch detection lines are connected to receive the touch detection signal detected by the touch array, and a signal processing is further performed on the touch detection signal. For example, the touch and integrated driver integrated chip 30 may also be configured to provide various signals (for example, display clock signals, frame start signals, common voltage signals, etc.) for display scanning to the driving circuit 10.

For example, the touch and display driver integrated chip 30 in the display device 1 provided by the embodiments of the present disclosure may be arranged on a printed circuit board (PCB) in the display device 1.

It should be noted that in the display device 1 as shown in FIG. 13, only one connecting line is schematically shown between the driving circuit 10 and the touch and display driver integrated chip 30, but it does not mean that the driving circuit 10 and the touch and display driver integrated chip 30 are only connected by one signal line.

Figure 14:
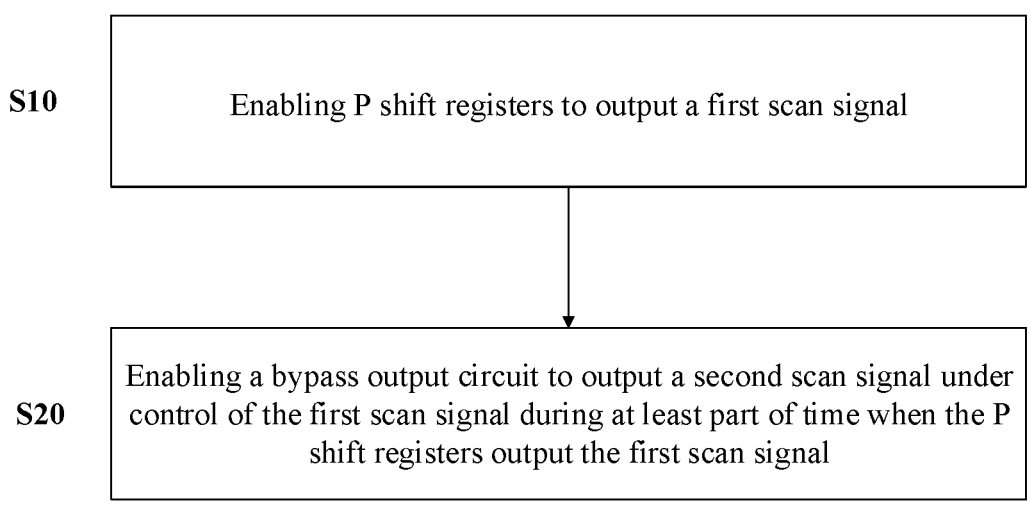
FIG. 14 is a schematic diagram of a driving method of a shift register circuit according to some embodiments of the present disclosure.

Some embodiments of the present disclosure also provide a driving method which can be used to drive any shift register circuit 100 provided by the embodiments of the present disclosure. As shown in FIG. 14, the driving method includes the following operation steps.

Step S10: enabling P shift registers to output a first scan signal; and

Step S20: enabling a bypass output circuit to output a second scan signal under control of the first scan signal during at least part of time when the P shift registers output the first scan signal.

For example, in the driving method provided by some embodiments of the present disclosure, the first scan signal and the second scan signal are both pulse signals, and the pulse width PS1 of the first scan signal and the pulse width PS2 of the second scan signal meet the following requirements: PS1=a*PS2, and a is greater than zero.

For example, in the driving method provided by some embodiments of the present disclosure, a=10.

For example, in the driving method provided by some embodiments of the present disclosure, a period PE1 of the first scan signal and a period PE2 of the second scan signal meet requirements: PE1=b*PE2, b>0.

For example, in the driving method provided by some embodiments of the present disclosure, $1 \le b \le 5$. For example, b=3.

It should be noted that the description of the first scan signal and the second scan signal (the touch clock signal) can refer to the corresponding descriptions in the above embodiments of the shift register circuits, which will not be described here.

Some embodiments of the present disclosure also provide a driving method which can be used to drive any display device 1 provided by embodiments of the present disclosure. As shown in FIG. 15, the driving method includes the following operation steps.

Step S100: driving one row pixel units of P rows of pixel units connected with a k-th stage shift register circuit to perform display scanning; and Step S200: driving one row of touch units connected with the k-th stage shift register circuit to perform touch scanning during at least part of time when the display scanning is performed.

For example, in the driving method provided by the embodiments of the present disclosure, a touch and display driver integration (TDDI) chip can be adopted to drive display scanning and touch scanning.

The driving method provided by the embodiments of the present disclosure can also scan and drive touch units TU during at least part of the time of scanning and driving the pixel units PU, which can simplify driving modes of the display scanning and the touch scanning of the display device adopting TDDI technology, so that the driving chip for the display device can save the timing logic unit, thereby reducing the cost, increasing the charging time of the pixel units PU, and improving the display quality.

The above is only the specific implementation of the present disclosure, but the protection scope of the present disclosure is not limited to this, and the protection scope of the present disclosure shall be subject to the protection scope of the claims.

What is claimed is:

1. A shift register circuit, comprising:
P shift registers that are cascaded, and a bypass output circuit, wherein each of the P shift registers comprises a first scan output terminal, the first scan output terminal is configured to output a first scan signal, the first scan signal is used for display scanning,
the bypass output circuit comprises Q control terminals and a second scan output, the Q control terminals of the bypass output circuit are configured to receive the first scan signal, and the bypass output circuit is configured to output a second scan signal under control of the first scan signal received by the Q control terminals respectively, the second scan signal is used for touch scanning, P is an integer greater than or equal to 2, and Q is an integer less than or equal to P.

2. The shift register circuit according to claim 1, wherein Q=P, the bypass output circuit comprises P transistors, P gate electrodes of the P transistors serve as the P control terminals of the bypass output circuit respectively, P first electrodes of the P transistors are connected with each other and serve as the second scan output, and are configured to output the second scan signal.

3. The shift register circuit according to claim 2, wherein P second electrodes of the P transistors are connected with each other, and are configured to receive a same touch clock signal, and in a case where one or more of the P transistors are turned on, the transistor or transistors being turned on output the touch clock signal as the second scan signal.

4. The shift register circuit according to claim 2, wherein P second electrodes of the P transistors receive different touch clock signals respectively, and in a case where one or more of the P transistors are turned on, the transistor or transistors being turned on output received touch clock signals as the second scan signal.

5. A driving circuit, comprising a plurality of shift register circuits, according to claim 1, which are cascaded.

6. A display device, comprising:
the driving circuit according to claim 5, and
a display panel, wherein the display panel comprises a display array and a touch array.

7. The display device according to claim 6, wherein the display array comprises N rows of pixel units, the touch array comprises M rows of touch units, the driving circuit comprises M shift register circuits that are cascaded, wherein M bypass output circuits of the driving circuit and the M rows of touch units are connected in one-to-one correspondence, N shift registers in the driving circuit and the N rows of pixel units are connected in one-to-one correspondence to output the first scan signal that enables to turn on the N rows of pixel units row-by-row, during at least part of time when the N shift registers output the first scan signal, the M bypass output circuits also output the second scan signal to drive the M rows of touch units, and wherein N and M are both integers greater than or equal to 2, and N=M*P.

8. The display device according to claim 7, wherein the display panel further comprises M touch drive lines, an m-th touch drive line is connected to a second scan output of an m-th stage shift register circuit and an m-th row touch unit, the m-th touch drive line is configured to receive the second scan signal from the m-th stage shift register circuit, and transmit the second scan signal to the m-th row touch unit, and wherein m is an integer satisfying 1≤m≤M.

9. The display device according to claim 7, wherein the display panel further comprises N gate lines, the driving circuit comprises N shift registers that are cascaded, an n-th gate line is connected to a first scan output of an n-th stage shift register and an n-th row pixel unit, the n-th gate line is configured to receive the first scan signal from the n-th stage shift register, and transmit the first scan signal to the n-th row pixel unit, and wherein n is an integer satisfying 1≤n≤N.

10. The display device according to claim 7, wherein the display panel further comprises a plurality of touch detection lines, an amount of the plurality of touch detection lines is equal to an amount of the M row touch units, and the plurality of touch detection lines and a plurality columns of touch units are connected in one-to-one correspondence, respectively, to receive touch detection signals generated by the plurality columns of touch units driven by the second scan signal.

11. The display device according to claim 7, wherein the display panel further comprises a plurality of data lines, an amount of the plurality of data lines is equal to an amount of the N rows of pixel units, and the plurality of data lines and a plurality columns of pixel units are connected in one-to-one correspondence, respectively, to provide data signals.

12. A driving method of the display device according to claim 7, comprising:

driving one row pixel units of P rows of pixel units connected with a k-th stage shift register circuit to perform display scanning; and driving one row of touch units connected with the k-th stage shift register circuit to perform touch scanning during at least part of time when the display scanning is performed, wherein k is an integer satisfying 1≤k≤M.

13. The driving method according to claim 12, wherein the display scanning and the touch scanning are driven by the touch and display driver integrated chip.

14. The display device according to claim 6, further comprising a touch and display driver integrated chip, wherein the touch and display driver integrated chip is configured to provide the touch clock signal for the driving circuit and receive the touch detection signals detected by the touch array.

15. A driving method of the shift register circuit according to claim 1, comprising:

enabling the P shift registers to output the first scan signal; and enabling the bypass output circuit to output the second scan signal under control of the first scan signal during at least part of time when the P shift registers output the first scan signal.

16. The driving method according to claim 15, wherein the first scan signal and the second scan signal are both pulse signals, and a pulse width PS1 of the first scan signal and a pulse width PS2 of the second scan signal meet requirements: PS1=a*PS2, a>0.

17. The driving method according to claim 16, wherein a=10.

18. The driving method according to claim 16, wherein a period PE1 of the first scan signal and a period PE2 of the second scan signal meet requirements: PE1=b*PE2, b>0.

19. The driving method according to claim 18, wherein 1≤b≤5.

* * * * *